(12) United States Patent
Korsunsky et al.

(10) Patent No.: US 6,589,061 B1
(45) Date of Patent: Jul. 8, 2003

(54) PRINTED CIRCUIT BOARD FOR STRADDLE MOUNT ELECTRICAL CONNECTOR AND METHOD FOR PASTING THE SAME

(75) Inventors: Iosif Korsunsky, Harrisburg, PA (US); Robert W. Brown, Harrisburg, PA (US); Kevin E. Walker, Hershey, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/094,499

(22) Filed: Mar. 7, 2002

(51) Int. Cl.$^7$ ................................................ H01R 12/20
(52) U.S. Cl. .......................................... 439/83; 439/79
(58) Field of Search ........................... 439/83, 79, 876, 439/55, 101

(56) References Cited

U.S. PATENT DOCUMENTS

| | | | | |
|---|---|---|---|---|
| 5,490,786 A | * | 2/1996 | Mosquera et al. | ............ 439/79 |
| 5,609,490 A | * | 3/1997 | Beesch et al. | ................ 439/79 |
| 5,947,753 A | * | 9/1999 | Chapman et al. | ............. 439/79 |
| 6,115,260 A | * | 9/2000 | Nakajima et al. | ........... 361/760 |
| 6,129,564 A | * | 10/2000 | Kawamae et al. | .......... 439/101 |
| 6,231,355 B1 | * | 5/2001 | Trammel et al. | .............. 439/79 |

* cited by examiner

*Primary Examiner*—Gary Paumen
*Assistant Examiner*—James R. Harvey
(74) *Attorney, Agent, or Firm*—WeiTe Chung

(57) ABSTRACT

A printed circuit board (1) for a straddle mount electrical connector (2) includes a first side surface (10) and a second side surface (12) opposite to the first side surface. Each of the side surfaces has a front and a rear rows of conductive pads (14), (16) and the conductive pads in the front row are staggered with respect to the conductive pads in the rear row. A number of solder pastes (11), (13) are applied through a solder stencil (18) to the conductive pads wherein each solder paste corresponding to the conductive pad in the front row is narrower and longer than the conductive pad. The straddle mount electrical connector has staggered signal and grounding contacts (221), (222) respectively secured to the front and the rear rows of conductive pads of the printed circuit board.

2 Claims, 8 Drawing Sheets

PRINTED CIRCUIT BOARD FOR STRADDLE MOUNT ELECTRICAL CONNECTOR AND METHOD FOR PASTING THE SAME

BACKGROUND OF THE INVENTION

1. Field of the Invention

The present invention relates to the art of electrical connectors, and particularly to a printed circuit board for a straddle mount electrical connector and a method for pasting the printed circuit board.

2. Description of the Related Art

Printed circuit boards are often used in the electronic field to receive electronic components, for example electrical connectors, thereon to cooperatively perform certain specified functions. One kind of electrical connector, so-called straddle mount electrical connector, is mounted to the printed circuit board with electrical contacts thereof electrically contacting with conductive pads on two opposite side surfaces of the printed circuit board.

When the conductive pads on a same side surface of the printed circuit board are arranged in two or more rows and a center line of one conductive pad in each row crosses or extends through a corresponding conductive pad in another row along a direction in which the straddle mount electrical connector is mounted to the printed circuit board, some of the electrical contacts of the straddle mount electrical connector would pass through the rows of conductive pads proximal to a front end of the printed circuit board to reach the conductive pads distal from the front end of the printed circuit board. Nevertheless, solder pastes are sometimes applied without reflowing over the conductive pads before the straddle mount electrical connector is applied to the printed circuit board, so the electrical contacts passing through proximal conductive pads often smear or plough most volumes of the "wet" solder pastes on these conductive pads, thereby causing shorting of the electrical contacts and reducing the reliability of the electrical connection between the conductive pads of the printed circuit board and the electrical contacts of the straddle mount electrical connector.

Therefore, an improved printed circuit board for a straddle mount electrical connector and a method for pasting the same are desired to resolve the above-mentioned problems.

SUMMARY OF THE INVENTION

A major object of the present invention is to provide a printed circuit board for a straddle mount electrical connector and a method for pasting the printed circuit board, which ensure an electrical connection between the printed circuit board and the straddle mount electrical connector.

A printed circuit board for a straddle mount electrical connector in accordance with the present invention comprises a first side surface and a second side surface opposite to the first side surface. Each side surface comprises a front and a rear rows of conductive pads and the conductive pads in the front row are staggered with respect to the conductive pads in the rear row. A plurality of solder pastes are applied to the conductive pads of the printed circuit board through a solder stencil having a plurality of openings. Each solder paste applied to the conductive pad in the front row is narrow and extends beyond the length of the conductive pad. The straddle mount electrical connector comprises an insulative housing and a pair of contact modules received in the insulative housing. Each contact module comprises a plurality of staggered signal and grounding contacts reaching corresponding conductive pads in the rear and the front rows of one of the first and the second side surfaces of the printed circuit board, respectively. The signal contacts, in reaching the conductive pads in the rear row, extend at least beside center lines of the solder pastes applied to the conductive pads in the front row, thereby reducing smearing or plowing volumes of these solder pastes by the signal contacts. After reflowing, the straddle mount electrical connector is reliably secured to the printed circuit board.

Other objects, advantages and novel features of the invention will become more apparent from the following detailed description of the present embodiment when taken in conjunction with the accompanying drawings.

DETAILED DESCRIPTION OF THE INVENTION

Figure 1:
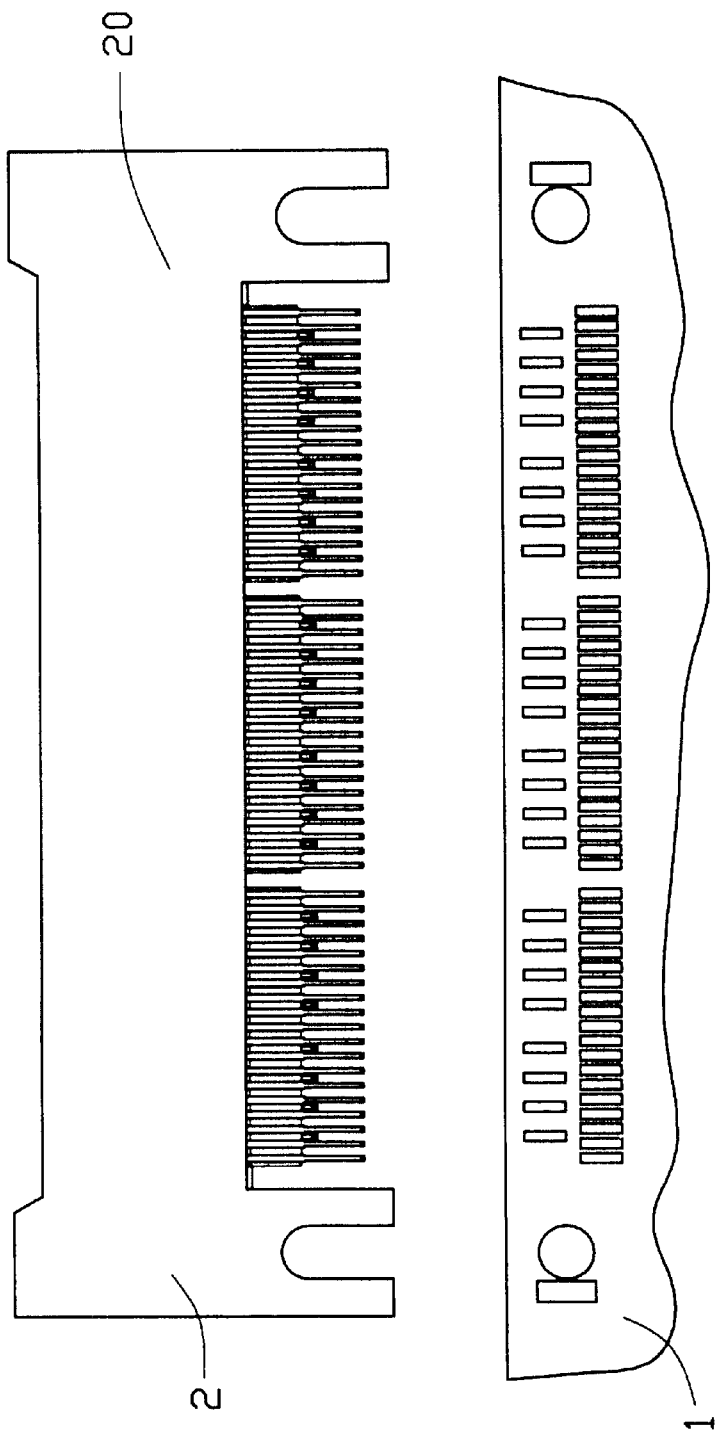
FIG. 1 is an exploded view of a printed circuit board in accordance with the present invention and a straddle mount electrical connector for mounting thereto.

It will be noted here that for a better understanding, most of like components are designated by like reference numerals through various figures in the embodiments.

Referring to FIG. 1, a printed circuit board 1 in accordance with a first embodiment of the present invention for a straddle mount electrical connector 2 is shown.

Figure 2:
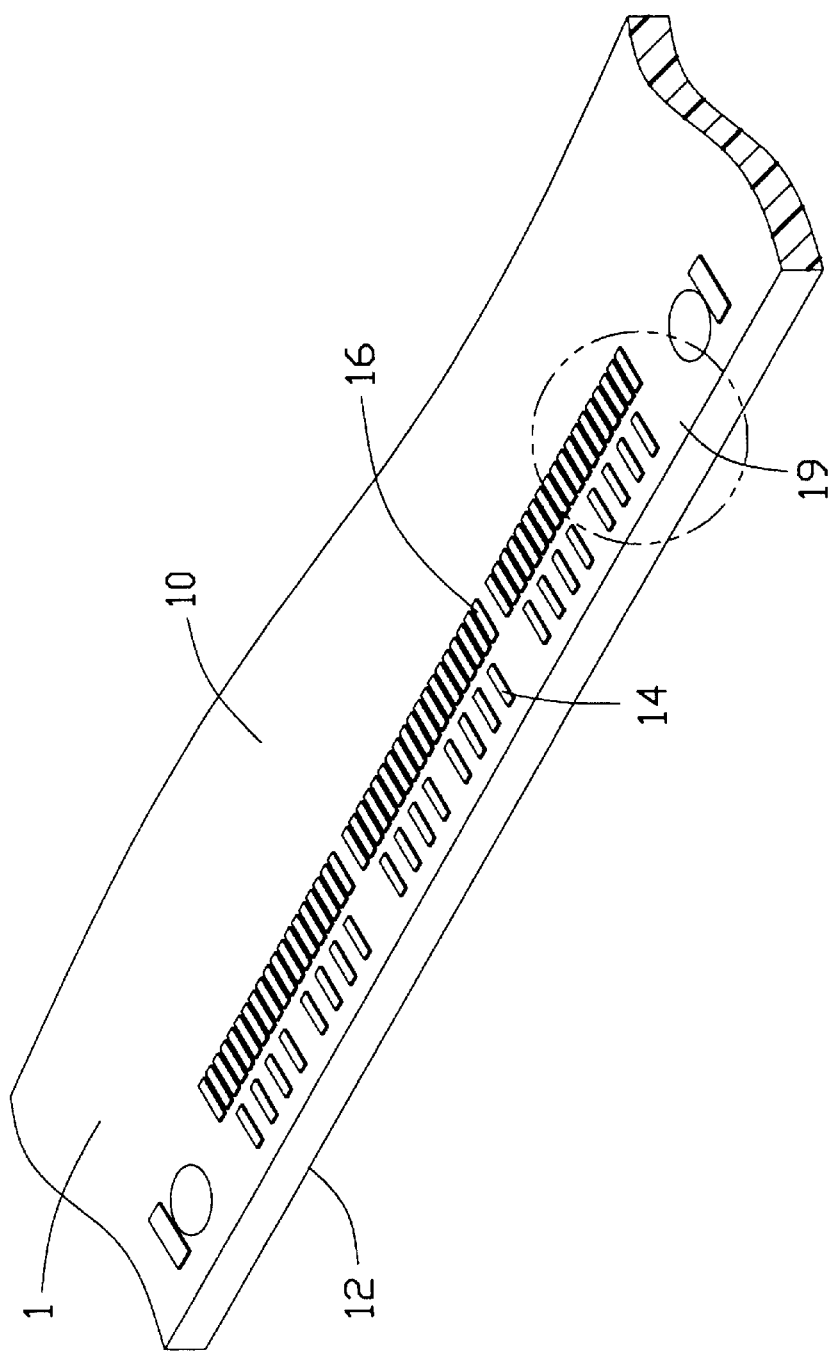
FIG. 2 is a schematically perspective view of the printed circuit board of FIG. 1.
Figure 3:
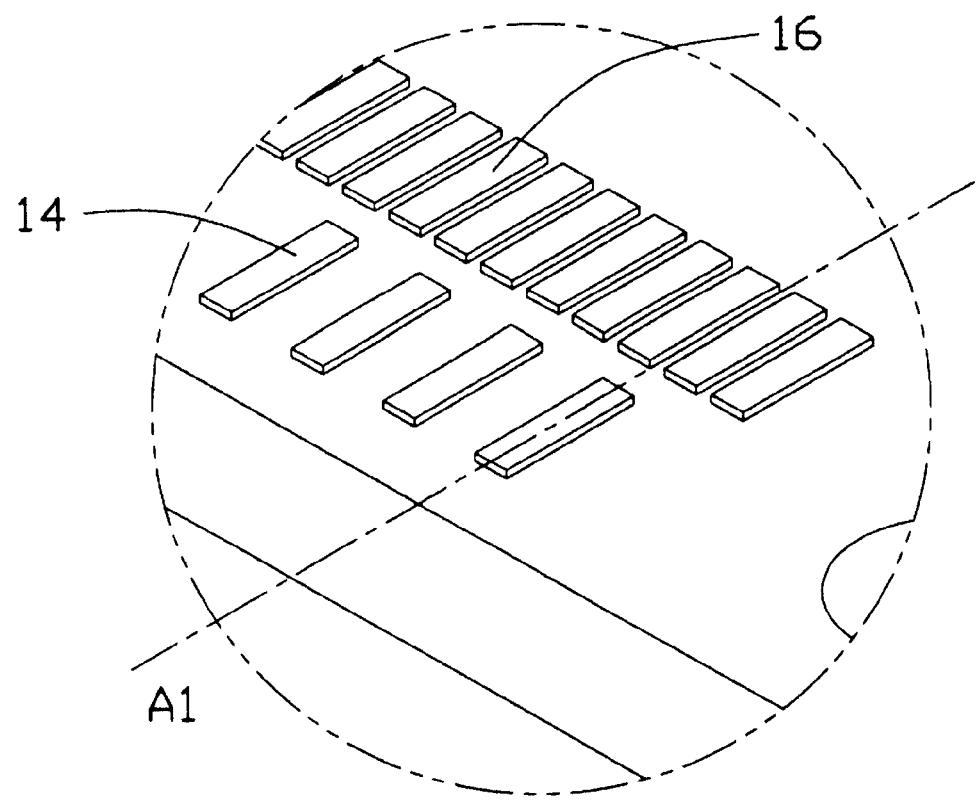
FIG. 3 is a partially enlarged perspective view taken from FIG. 2.

Referring also to FIGS. 2 and 3, the printed circuit board 1 is configured in ways known to persons skilled in the pertinent art and defines a side surface 10, a side surface 12 opposite to the side surface 10, a front row of conductive pads 14 on each side surface 10, 12, and a rear row of conductive pads 16 located to the rear of the front row of conductive pads 14. The front row of conductive pads 14 are located nearer to a front end 19 of the printed circuit board 1 than the rear row of conductive pads 16. The conductive pads 14 are staggered with respect to the conductive pads 16, that is, a center line A1 of each conductive pad 14 offsets from or extends beside any of the conductive pads 16 or crosses or extends through none of the conductive pads 16 in a front-to-back direction.

Figure 6:
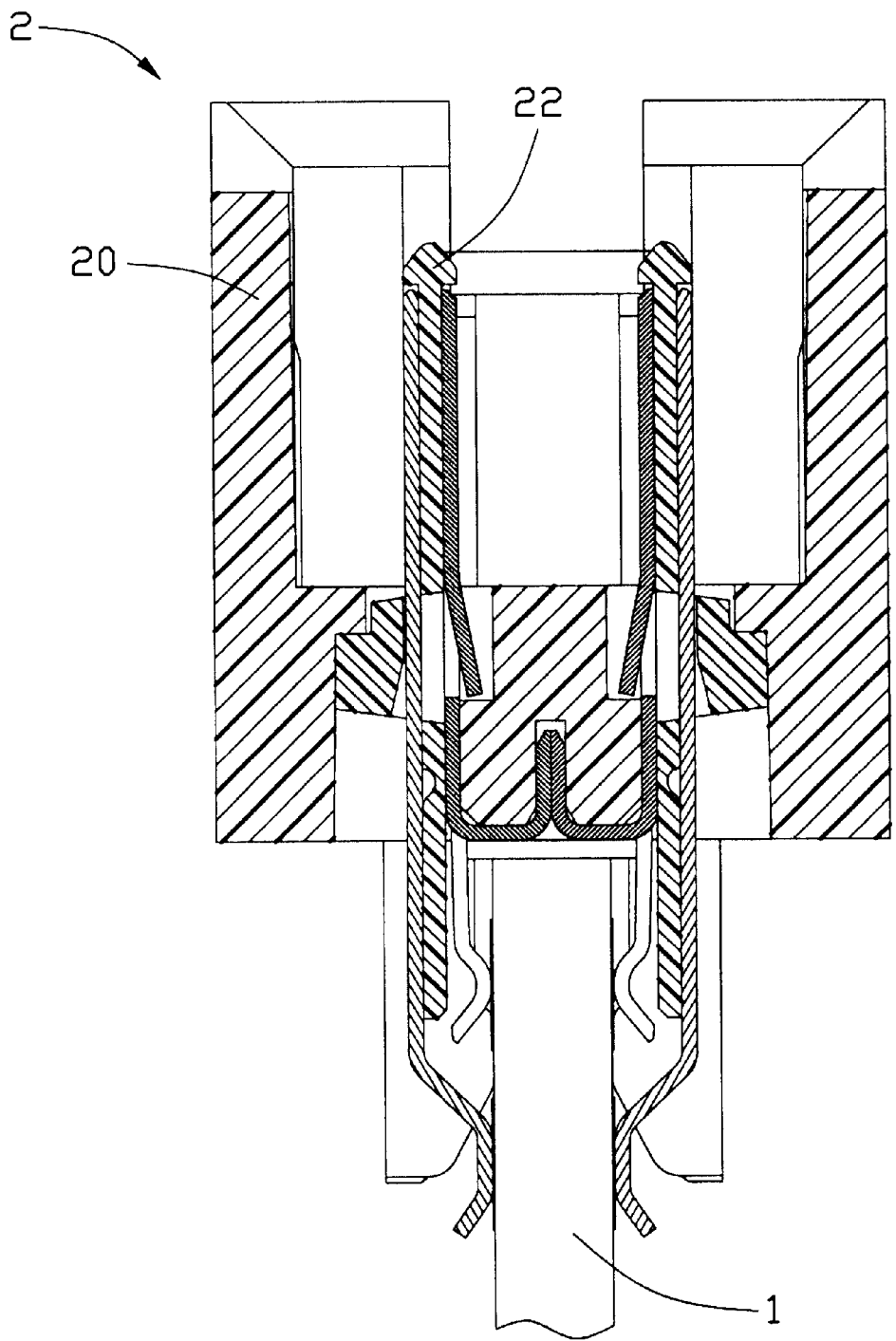
FIG. 6 is a cross-sectional view of the straddle mount electrical connector of FIG. 1 with the printed circuit board being received between mounting tails of signal and grounding contacts of contact modules thereof.
Figure 7:
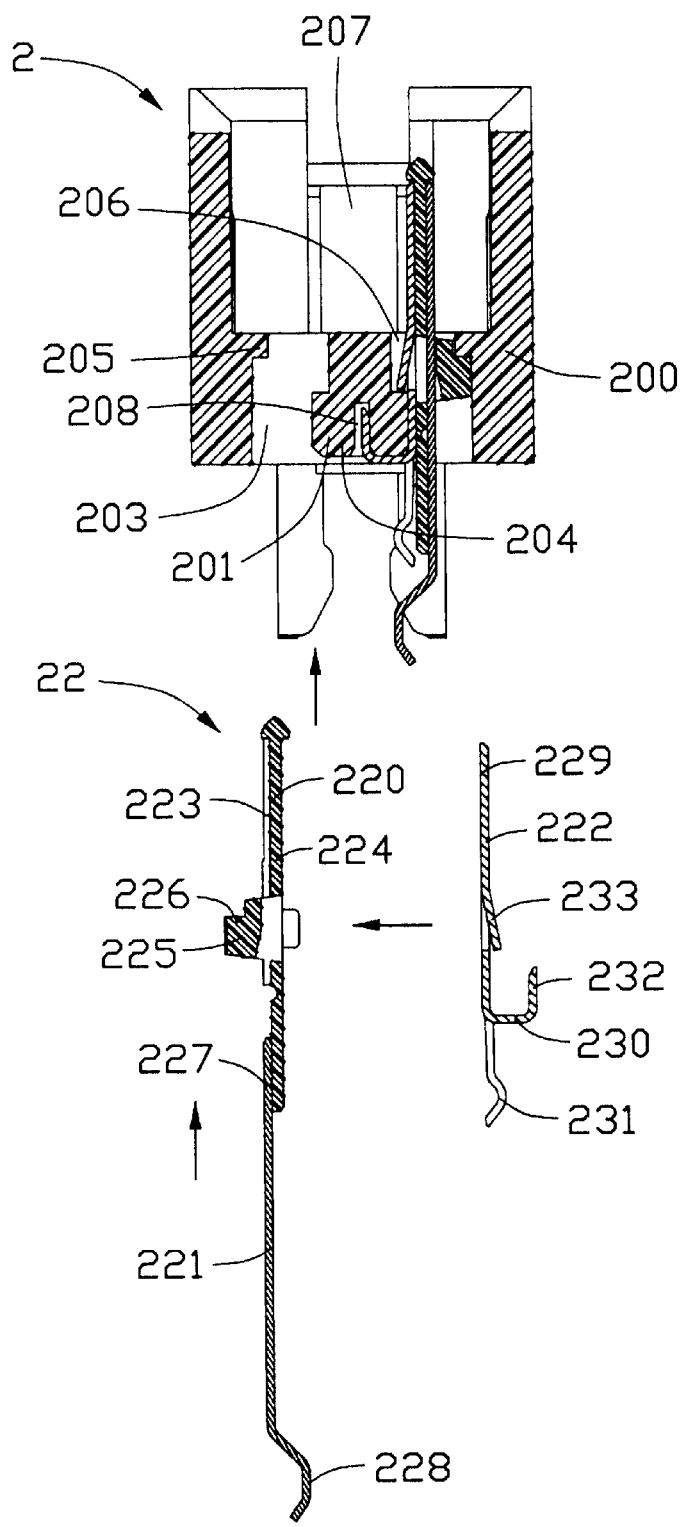
FIG. 7 is a view similar to FIG. 6 but the contact module of the straddle mount electrical connector without the printed circuit board is retreated therefrom and is explode.

The straddle mount electrical connector 2 could be adapted in any configuration so long as it has staggered electrical contacts to be mounted to two or more rows of conductive pads on a same side of the printed circuit board 1. Referring also to FIGS. 6 and 7, the straddle mount electrical connector 2 of the exemplifying embodiment of the present invention comprises an insulative housing 20 and a pair of contact modules 22. The insulative housing 20 comprises a pair of side walls 200 and a bottom wall 201 connecting with the side walls 200. The bottom wall 201 defines a pair of cavities 203 in communication with a space 207 between the side walls 200 and above the bottom wall 201, and a central block 204 between the cavities 203. A step 205 extends into an upper section of each of the cavities 203 and is oppositely spaced from the central block 204. The central block 204 defines a pair of cutouts 206 in an upper section thereof opening to the space 207 and the cavities 203, and a slit 208 recessed centrally from a bottom thereof.

Each contact module 22 comprises an insulative portion 220, a plurality of signal contacts 221 and a plurality of grounding contacts 222. The insulative portion 220 comprises a first side 223, a second side 224 opposite to the first side 223 and a retention section 225 protruding from the first side 223. The retention section 225 is formed with a protrusion 226 extending outwardly to engage with the step 205 of the insulative housing 20 when the contact module 22 is inserted into the cavity 203 of the insulative housing 20 to prevent the further upward movement of the contact module 22.

The signal contacts 221 are attached to the first side 223 of the insulative portion 220 and each comprises a contact section 227 located in an upper section of the insulative portion 220 to expose in the space 207 of the insulative housing 20 for engaging with signal contacts of a complementary electrical connector (not shown), and a mounting tail 228 extending beyond a lower section of the insulative portion 220.

The grounding contacts 222 are attached to the second side 224 of the insulative portion 220 and each comprises a contacting section 229 located in the upper section of the insulative portion 220 to expose to the space 207 for electrically engaging with grounding contacts of the complementary electrical connector, a U-shaped retention section 230 located at the lower section of the insulative portion 220 and having a tail 232 extending into the slit 208 of the central block 201 for retaining the contact module 22 to the central block 201, a tab 233 extending outwardly and downwardly to be received in the cutout 206 of the central block 201 for preventing the contact module 22 from downwardly moving, and a mounting tail 231 extending parallel to and vertically shorter than the mounting tail 228 of the signal contact 221. The mounting tails 231 of the grounding contacts 222 are staggered with respect to the mounting tails 228 of the signal contacts 221.

Figure 4:
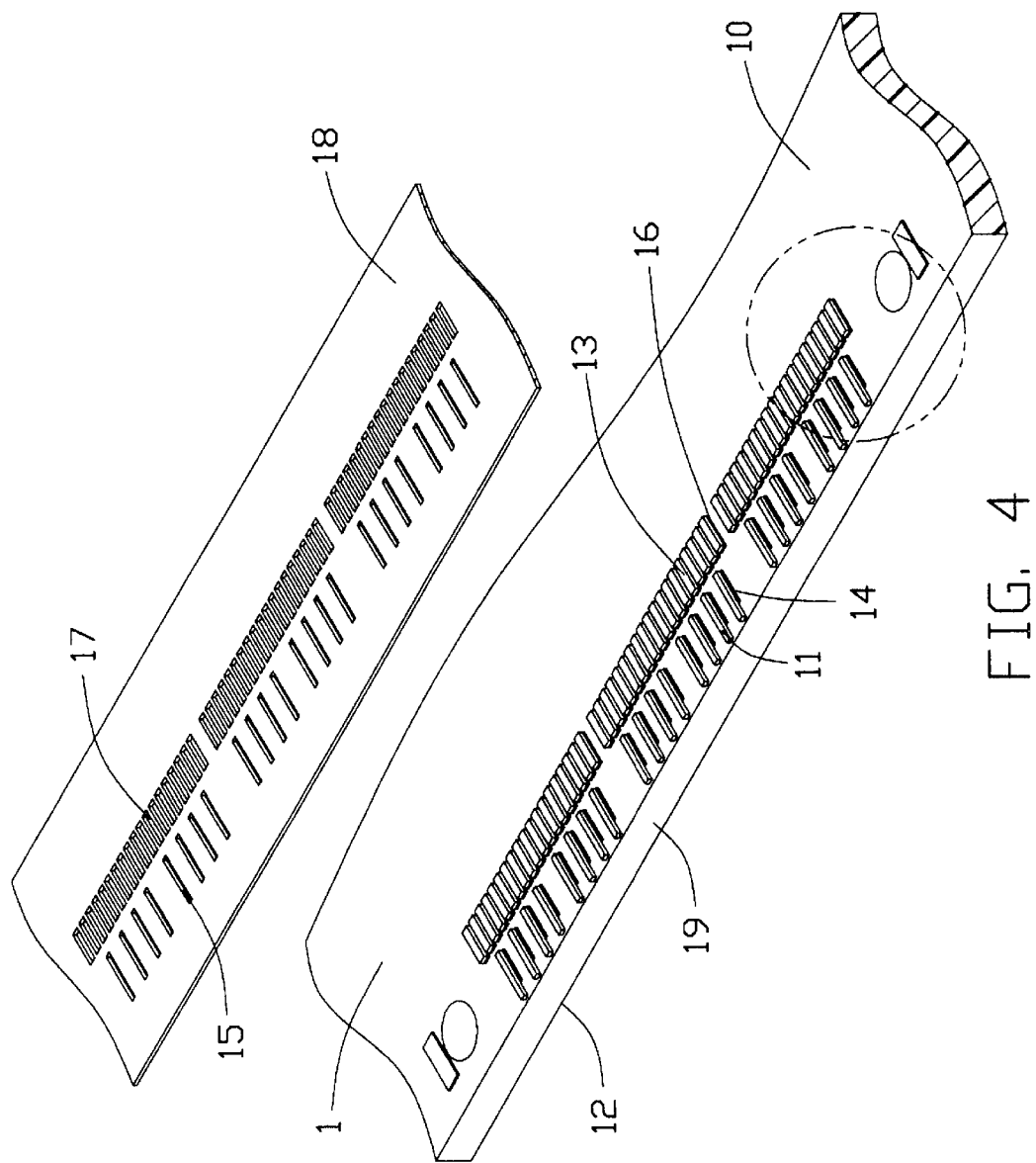
FIG. 4 is a view similar to FIG. 2 but solder pastes have been applied to the printed circuit board and a solder stencil is shown above.
Figure 5:
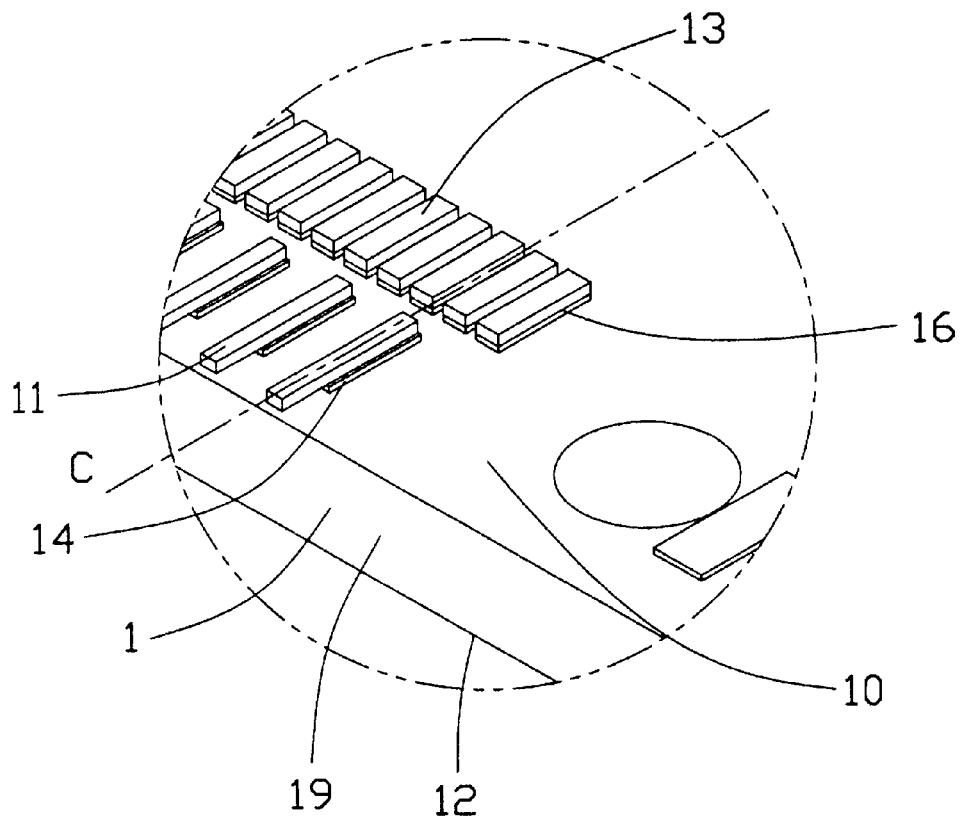
FIG. 5 is a partially enlarged perspective view taken from FIG. 4.

Referring also to FIG. 4, a solder stencil 18 is provided with a front and a rear rows of openings 15, 17. The openings 15 is staggered with respect to the openings 17. A front and a rear rows of solder pastes 11, 13 are then applied through the openings 15, 17 of the solder stencil 18 to the conductive pads 14, 16 of each side surface 10, 12, respectively. The opening 15 is configured as narrowly as possible in order to have the solder paste 11 that is applied through the opening be as narrow as possible (herein exemplified as narrower than the conductive pad 14). The opening 15 is configured in such a way that the solder paste 11 extends in a relatively long way (herein exemplified as beyond the length of the corresponding conductive pad 14) to provide sufficient solder paste volume for soldering the mounting tail 231 of the grounding contact 222 to the conductive pad 14.

A center line C of each solder paste 11 offsets from or extends beside any of the solder pastes 13, that is, the center line C of each solder paste 11 crosses or extends through none of the solder pastes 13 in the front-to-back direction.

The straddle mount electrical connector 2 is then applied to the printed circuit board 1 by way of receiving the front end 19 of the printed circuit board 1 into between the mounting tails 228, 231 of the contact modules 22 thereof. The mounting tails 228 of the signal contacts 221 extend vertically longer than the mounting tails 231 of the grounding contacts 222. The mounting tails 228 extend further than the mounting tails 231 to reach the conductive pads 16 with the solder pastes 13, while the mounting tails 231 extend to reach the conductive pads 14 with the solder pastes 11. The conductive pads 14, 16 are staggered by offsetting the center lines A1 of the conductive pads 14 from the conductive pads 16. The solder pastes 11, 13 are staggered by offsetting the center lines C of the solder pastes 11 from the solder pastes 13. Volumes of the solder pastes 11 on the conductive pads 14 smeared or ploughed by the mounting tails 228 adjacent to the mounting tails 231 corresponding to the conductive pads 14 are reduced. Furthermore, as is described above, the solder pastes 11 are made as narrow as possible. Thus, the least possible volume of the solder pastes 11 are ploughed or smeared by the mounting tails 228 and the electrical connection between the signal and the grounding contacts 221, 222 and the conductive pads 16, 14 is ensured.

After the mounting tails 228, 231 reach the conductive pads 16, 14 with the solder pastes 13, 11, the reflowing process or like means is applied so that the mounting tails 228, 231 are soldered to the conductive pads 16, 14 by the solder pastes 13, 11, respectively, to reliably secure the straddle mount electrical connector 2 to the printed circuit board 1.

Figure 8:
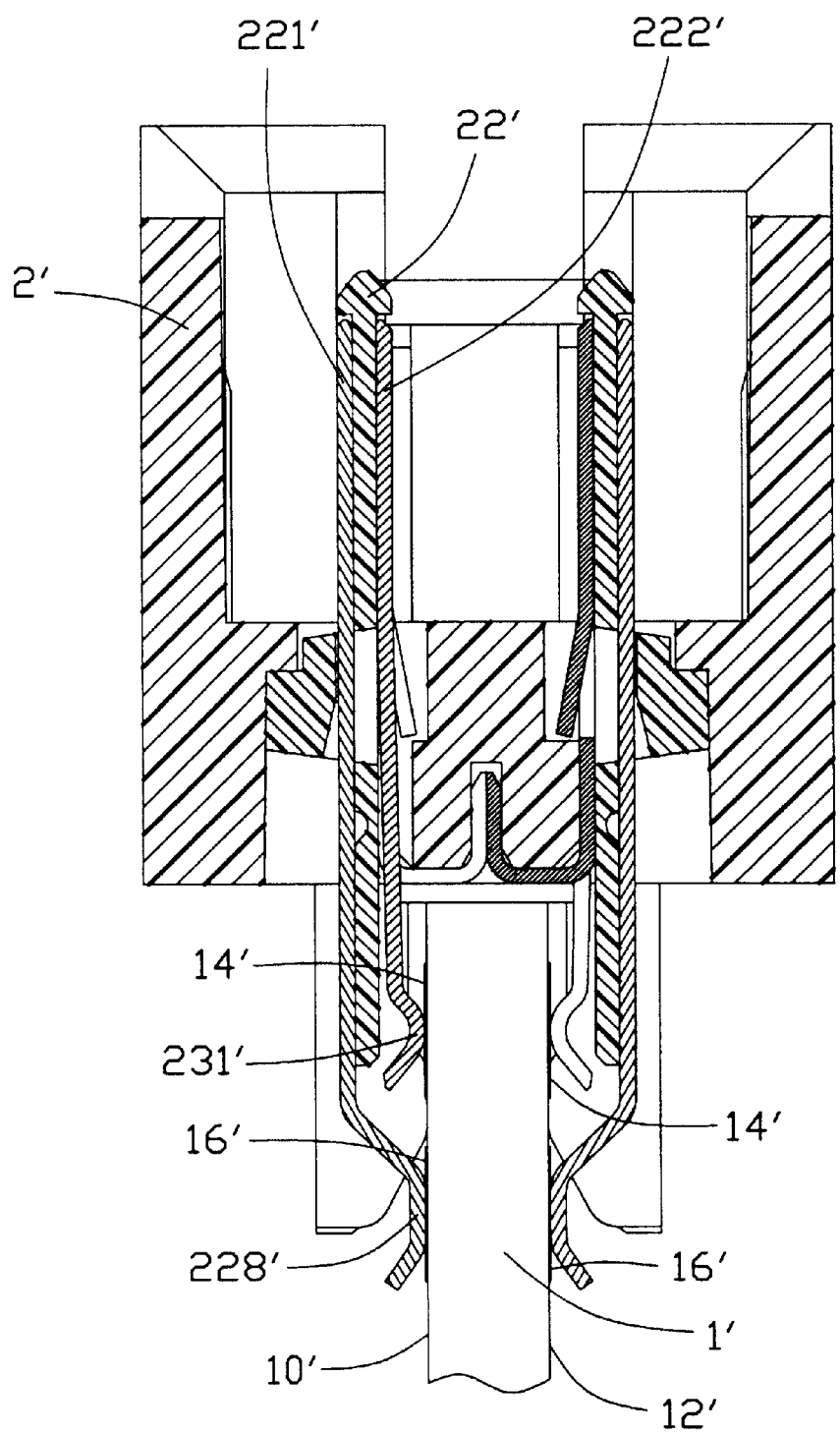
FIG. 8 is a view similar to FIG. 6 but showing a printed circuit board in accordance with a second embodiment of the present invention and a straddle mount electrical connector mounted thereto.

Referring to FIG. 8, a printed circuit board 1' in accordance with a second embodiment of the present invention for use with a straddle mount electrical connector 2' is shown. The printed circuit board 1' and the straddle electrical connector 2' are similar to the printed circuit board 1 and the straddle electrical connector 2 of the first embodiment, except that a front and a rear rows of conductive pads 14', 16' in one side surface 10' of the printed circuit board 1' is so arranged as to have a center line of each conductive pad 14' in the front row extend through a corresponding conductive pad 16' in the rear row, and one of the two contact modules 22' of the straddle mount electrical connector 2' is so configured as to align a mounting tail 231' of one grounding contact 222' with a mounting tail 228' of one signal contact 221'.

Another side surface 12' of the printed circuit board 1' and another one of the two contact modules 22' of the straddle mount electrical connector 2', however, are configured the same as in the first embodiment, that is, staggering the conductive pads 14' in the front row with respect to the conductive pads 16' in the rear row and accordingly staggering the mounting tails 231' of the grounding contacts 222' with respect to the mounting tails 228' of the signal contacts 221'.

The conductive pads 14', 16' on the side surface 10' are applied with solder pastes (not shown) and are subject to reflowing to solidify the solder pastes. The conductive pads 14', 16' on the side surface 12' are applied with solder pastes (not shown) through a solder stencil (not shown) configured similarly to the solder stencil 18 of the first embodiment to ensure that the solder pastes applied to the conductive pads 14' are narrower than the conductive pads 14' and offset from the solder pastes applied to the conductive pads 16'. The solder paste applied to each conductive pad 14' extends in a relatively longer way (herein exemplified as beyond the length of the conductive pad 14') to provide sufficient solder volume for reliably soldering the mounting tails 231' of the grounding contacts 222' to the conductive pads 14'.

The straddle mount electrical connector 2' is then applied to the printed circuit board 1' until the conductive pads 14', 16' are reached by the mounting tails 231', 228' of the grounding and the signal contacts 222', 221', respectively. In the course of reaching the mounting tails 228' to the conductive pads 16', the "wet" solder pastes on the conductive pads 14' of the side surface 12' are smeared or ploughed as least possible by the mounting tails 228' of the signal contacts 221' of the contact module 22. This is a result of the staggered patterns of the signal and the grounding contacts 221', 222' and the conductive pads 16', 14' and the narrowness of the solder pastes on the conductive pads 14'. After subjecting to a reflowing process, the mounting tails 231', 228' of the straddle mount electrical connector 2' are reliably secured to the conductive pads 14', 16' of the printed circuit board 1'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board for a straddle mount electrical connector comprising a plurality of electrical contacts, comprising:

a first side surface defining a first row of conductive pads and a second row of conductive pads thereon for respectively mounting a plurality of first electrical contacts and a plurality of second electrical contacts of a straddle mount electrical connector, the first row of conductive pads being staggered with respect to the second row of conductive pads;

a second side surface being opposite to the first side surface; and a plurality of first and second solder pastes being respectively applied to the first and the second rows of conductive pads;

wherein the printed circuit board comprises a front end and the first row of conductive pads are located nearer to the front end than the second row of conductive pads;

wherein the first solder paste is narrower and longer than the corresponding conductive pad in the first row;

wherein each of the first row of conductive pads has a first center line offset from any of the second row of conductive pads and the first solder pastes each define a second center line offset from any of the second solder pastes;

wherein the second side surface has a third row of conductive pads and a fourth row of conductive pads thereon for respectively mounting a plurality of third electrical contacts and a plurality of fourth electrical contacts of the straddle mount electrical connector;

wherein each conductive pad in the third row has a third center line extending through a corresponding conductive pad in the fourth row;

wherein a plurality of third solder pastes and a plurality of fourth solder pastes are respectively applied to the third and the fourth rows of conductive pads and are reflowed;

wherein each conductive pad in the third row defines a third center line extending through none of the conductive pads in the fourth row;

wherein a plurality of third solder pastes and a plurality of fourth solder pastes are respectively applied to the third and the fourth rows of conductive pads and the third solder paste is narrower and longer than the conductive pad in the third row.

2. An electrical assembly comprising:

a straddle mount electrical connector comprising an insulative housing, a plurality of first electrical contacts and a plurality of second electrical contacts received in the insulative housing, and each of the first and the second electrical contacts comprising a mounting tail, the mounting tails of the first electrical contacts extending shorter than and being staggered with respect to the mounting tails of the second electrical contacts; and a printed circuit board comprising a first side surface and a second side surface opposite to the first side surface, the first side surface comprising a first and a second rows of conductive pads respectively corresponding to the mounting tails of the first and the second electrical contacts, and a plurality of first and second solder pastes respectively applied to the first and the second rows of conductive pads, the first row of conductive pads being staggered with respect to the second row of conductive pads;

wherein the first solder paste is narrower than the corresponding conductive pad in the first row;

wherein the second side surface of the printed circuit board comprises a third row of conductive pads and a fourth row of conductive pads and the straddle mount electrical connector comprises a plurality of third electrical contacts and a plurality of fourth electrical contacts respectively mounted to the third and the fourth rows of conductive pads;

wherein each of the third and the fourth electrical contacts comprise a mounting tail and the mounting tails of the third electrical contacts are staggered with respect to the mounting tails of the fourth electrical contacts, the conductive pads in the third row being staggered with respect to the conductive pads in the fourth row;

wherein the staggered adjacent first and second solder pads are substantially partially overlapped in an assembling direction of said connector and said printed circuit board, and the corresponding first solder paste is narrower than the first solder pad so as to allow the mounting tail of the corresponding second electrical contact to pass by said corresponding first solder paste and reach said corresponding second solder paste without smearing said first solder paste.

* * * * *